United States Patent
Ueng et al.

(10) Patent No.: US 8,977,934 B2
(45) Date of Patent: Mar. 10, 2015

(54) METHOD OF EARLY TERMINATION OF CHANNEL DECODING BY RE-ENCODING

(71) Applicant: National Tsing Hua University, Hsinchu (TW)

(72) Inventors: Yeong-Luh Ueng, Hsinchu (TW); Mao Ruei Li, New Taipei (TW)

(73) Assignee: National Tsing Hua University, Hsinchu (TW)

( * ) Notice: Subject to any disclaimer, the term of this patent is extended or adjusted under 35 U.S.C. 154(b) by 122 days.

(21) Appl. No.: 13/758,483

(22) Filed: Feb. 4, 2013

(65) Prior Publication Data

US 2014/0223253 A1    Aug. 7, 2014

(51) Int. Cl.
*H03M 13/00*  (2006.01)
*H03M 13/37*  (2006.01)
*G06F 11/10*  (2006.01)
*H03M 13/29*  (2006.01)
*H03M 13/11*  (2006.01)

(52) U.S. Cl.
CPC ........... *H03M 13/3776* (2013.01); *G06F 11/10* (2013.01); *H03M 13/3738* (2013.01); *H03M 13/3753* (2013.01); *H03M 13/2951* (2013.01); *H03M 13/2975* (2013.01); *H03M 13/1128* (2013.01)
USPC .......................................... 714/774; 714/780

(58) Field of Classification Search
CPC ..................... H03M 13/3776; H03M 13/2951; H03M 13/2975; H03M 13/3753; H03M 13/1128; H03M 13/3738
USPC .................................................. 714/774, 780
See application file for complete search history.

(56) References Cited

U.S. PATENT DOCUMENTS

| | | | | |
|---|---|---|---|---|
| 5,265,122 A * | 11/1993 | Rasky et al. | ............... | 375/346 |
| 5,949,796 A * | 9/1999 | Kumar | ............... | 370/529 |
| 6,246,698 B1 * | 6/2001 | Kumar | ............... | 370/487 |
| 6,567,481 B1 * | 5/2003 | Molnar | ............... | 375/341 |
| 6,697,441 B1 * | 2/2004 | Bottomley et al. | ............... | 375/340 |
| 6,785,341 B2 * | 8/2004 | Walton et al. | ............... | 375/267 |
| 6,865,708 B2 * | 3/2005 | Wang | ............... | 714/758 |
| 6,885,711 B2 * | 4/2005 | Shiu et al. | ............... | 375/340 |
| 6,967,598 B2 * | 11/2005 | Mills | ............... | 341/50 |
| 7,046,694 B2 * | 5/2006 | Kumar | ............... | 370/487 |
| 7,260,762 B2 * | 8/2007 | Desai et al. | ............... | 714/755 |
| 7,500,167 B2 * | 3/2009 | Widdup | ............... | 714/752 |
| 7,602,839 B2 * | 10/2009 | Kolze et al. | ............... | 375/148 |
| 7,607,053 B2 * | 10/2009 | Moelker | ............... | 714/704 |
| 7,895,495 B2 * | 2/2011 | Boer et al. | ............... | 714/748 |
| 7,904,020 B2 * | 3/2011 | Dankberg et al. | ............... | 455/12.1 |
| 7,966,545 B2 * | 6/2011 | Cho et al. | ............... | 714/755 |
| 8,335,949 B2 * | 12/2012 | Chugg et al. | ............... | 714/704 |
| 8,392,804 B2 * | 3/2013 | Kim et al. | ............... | 714/776 |
| 8,630,335 B2 * | 1/2014 | Mizrahi et al. | ............... | 375/227 |

(Continued)

*Primary Examiner* — Joseph D Torres
(74) *Attorney, Agent, or Firm* — Jackson IPG PLLC

(57) ABSTRACT

A system providing early termination for channel decoding by re-encoding including a decoding unit, an encoding unit connected to the decoding unit, and a checking unit connected to the decoding unit and to the encoding unit. Via the system, decoded message words produced from the decoding unit are sent back to the encoding unit for re-encoding. Re-encoded words are compared to the decoded codewords by the checking unit and, if they are completely the same, the decoding action of the decoding unit is terminated. The system reduces power consumption and offers a simplified structure, improved decoding throughput, and reduced hardware complexity.

5 Claims, 6 Drawing Sheets

(56) References Cited

U.S. PATENT DOCUMENTS

| | | | |
|---|---|---|---|
| 8,739,004 B2* | 5/2014 | Olcay et al. | 714/780 |
| 2001/0050926 A1* | 12/2001 | Kumar | 370/529 |
| 2003/0023920 A1* | 1/2003 | Jeong et al. | 714/755 |
| 2008/0232440 A1* | 9/2008 | Yousef et al. | 375/148 |
| 2010/0332939 A1* | 12/2010 | Shimanuki | 714/752 |

* cited by examiner

US 8,977,934 B2

1

METHOD OF EARLY TERMINATION OF CHANNEL DECODING BY RE-ENCODING

BACKGROUND OF THE INVENTION

1. Field of the Invention

The present invention relates to a main purpose of this invention is to provide a method of early termination for channel decoding by re-encoding, which achieves saved power consumption, simplified structure, improved decoding throughput and less hardware complexity.

2. Description of Related Art

A conventional method of early termination needs an additional hardware for calculating syndromes for decoded words. If the syndromes are zero, then go the pre-due stop. Taking a low-density parity check code as example, the decoded codeword multiplies with a parity check matrix. If the product is zero which means the decoded codeword is legal, then go the pre-due stop. The decoded codeword (result) is then output.

However, in the case of the systematic (6, 62)—regular (9300, 8405) low-density parity check code, the matrix multiplication of the decoded word and the parity-check matrix needs 55800 2-input AND operations and 900 62-input Exclusive-OR operations and thus should be complex. Furthermore, the currently error correcting code chip usually has an encoder and a decoder which do not work together.

For this reason, the inventors has studied and proceeded in-depth discussion, and actively seek approaches for many years engaged in the research and experiences of related industries and manufacturing. After long-term research and efforts in development, the inventors has finally successfully developed this invention 'method of early termination for channel decoding by re-encoding' which overcomes the shortages in the prior art.

SUMMARY OF THE INVENTION

A main purpose of this invention is to provide a method of early termination for channel decoding, which achieves saved power consumption, simplified structure, improved decoding throughput and less hardware complexity.

In order to achieve the above and other objectives, the method of early termination for channel decoding by re-encoding according to the invention at least includes a decoding unit, an encoding unit connected to the decoding unit, and a checking unit connected to the decoding unit and the encoding unit; by means of the configuration of the above units, message words obtained from the decoding unit are sent back to the encoding unit for re-encoding; the re-encoded words are compared to the decoded codewords by the checking unit; and if they are completely the same, then terminate the decoding action of the decoding unit.

In one embodiment of the invention, the checking unit is a logical circuit.

In one embodiment of the invention, the channel unit can be wireless, wired or other medium for transmission or storage.

In one embodiment of the invention, if the error correcting code is a systematic code, then it only necessary to check by the checking unit to see if parity bits (parity word) obtained after re-encoding are the same with parity bits (parity word) obtained after decoding; and if yes, then stop decoding.

In one embodiment of the invention, if the comparison result is not entirely consistent, then the number of inconsis-

2 tent bits can be used to estimate the channel signal-to-noise ratio, and the decoder (system) can use this information for the corresponding action.

In one embodiment of the invention, since incorrect codewords are seldom received in channel with high signal-to-noise ratio, there is no need to decode received codewords with no error. The channel value are sent to hard decision which is existing hardware in the decoder and decoding unit. The hard decision of the received codeword can be directly fed to the encoding unit for determination of early termination. If the comparison result for codewords is consistent, there is no need to decode, increasing the decoding throughput at high signal-to-noise ratio.

DETAILED DESCRIPTION OF THE PREFERRED EMBODIMENTS

The aforementioned illustrations and following detailed descriptions are exemplary for the purpose of further explaining the scope of the present invention. Other objectives and advantages related to the present invention will be illustrated in the subsequent descriptions and appended tables.

Figure 1:
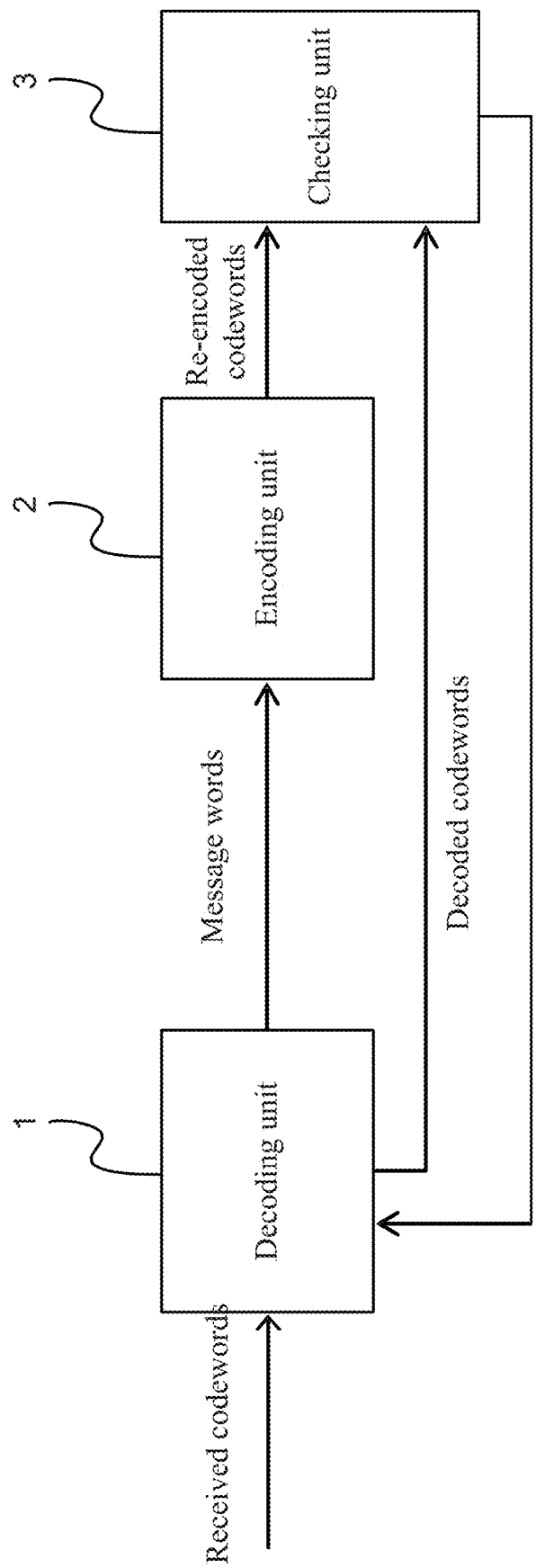
FIG. 1 is a schematic view of a fundamental configuration of implementing a method of early termination for channel decoding by re-encoding according to the invention.

FIG. 1 is a schematic view of a fundamental configuration of implementing a method of early termination for channel decoding by re-encoding according to the invention. The method of early termination for channel decoding by re-encoding according to the invention at least includes a decoding unit 1, an encoding unit 2 connected to the decoding unit 1, and a checking unit 3 connected to the decoding unit 1 and the encoding unit 2. The checking unit 3 can be a logic circuit. Thereby decoded message words produced by the decoding unit 1 are sent to the encoding unit 2 for re-encoding. The re-encoded words are compared to the decoded codewords by the checking unit 3. If they are completely the same, then terminate the decoding action of the decoding unit 1.

The checking unit 3 can be a logic circuit.

Figure 2:
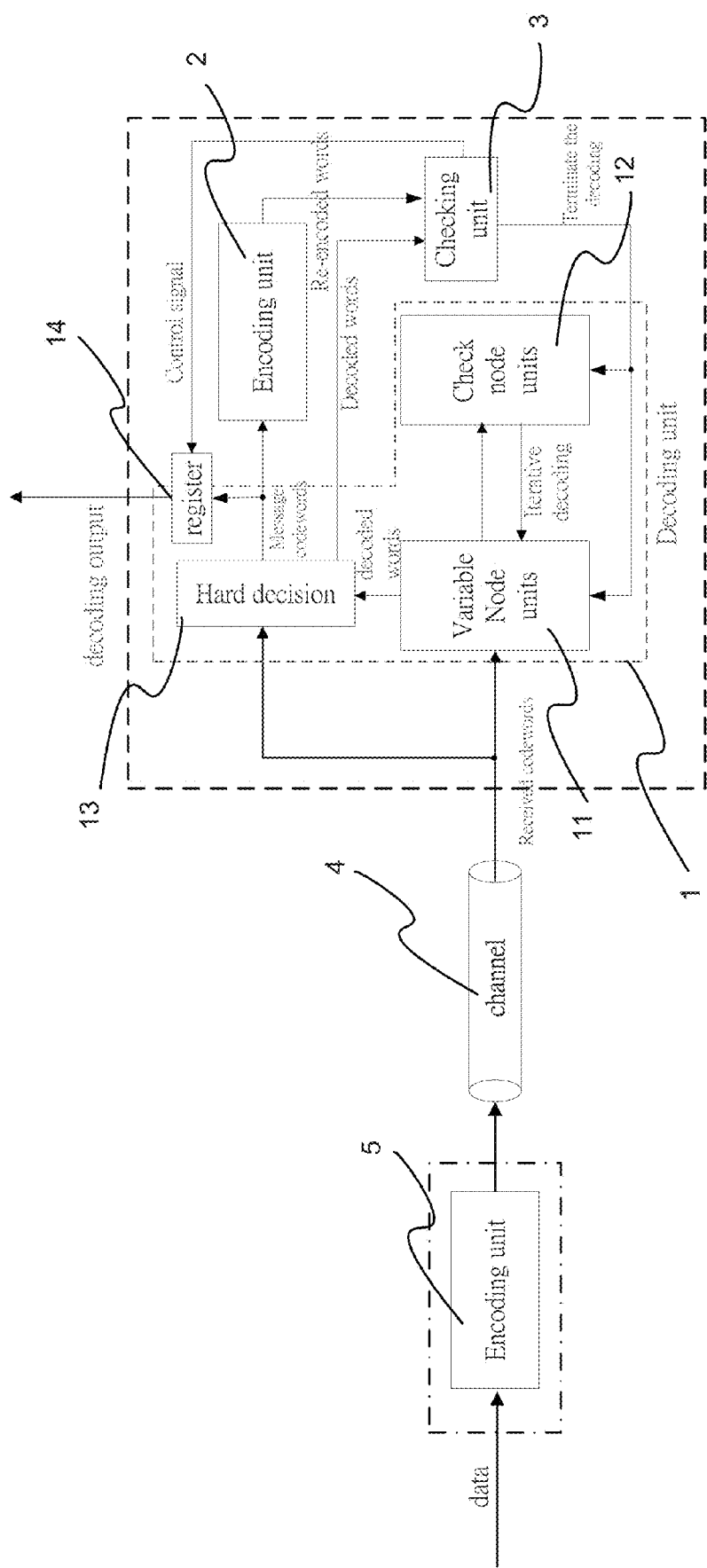
FIG. 2 is a schematic view of a configuration of implementing a method of early termination for channel decoding by re-encoding according to a first embodiment of the invention.
Figure 3:
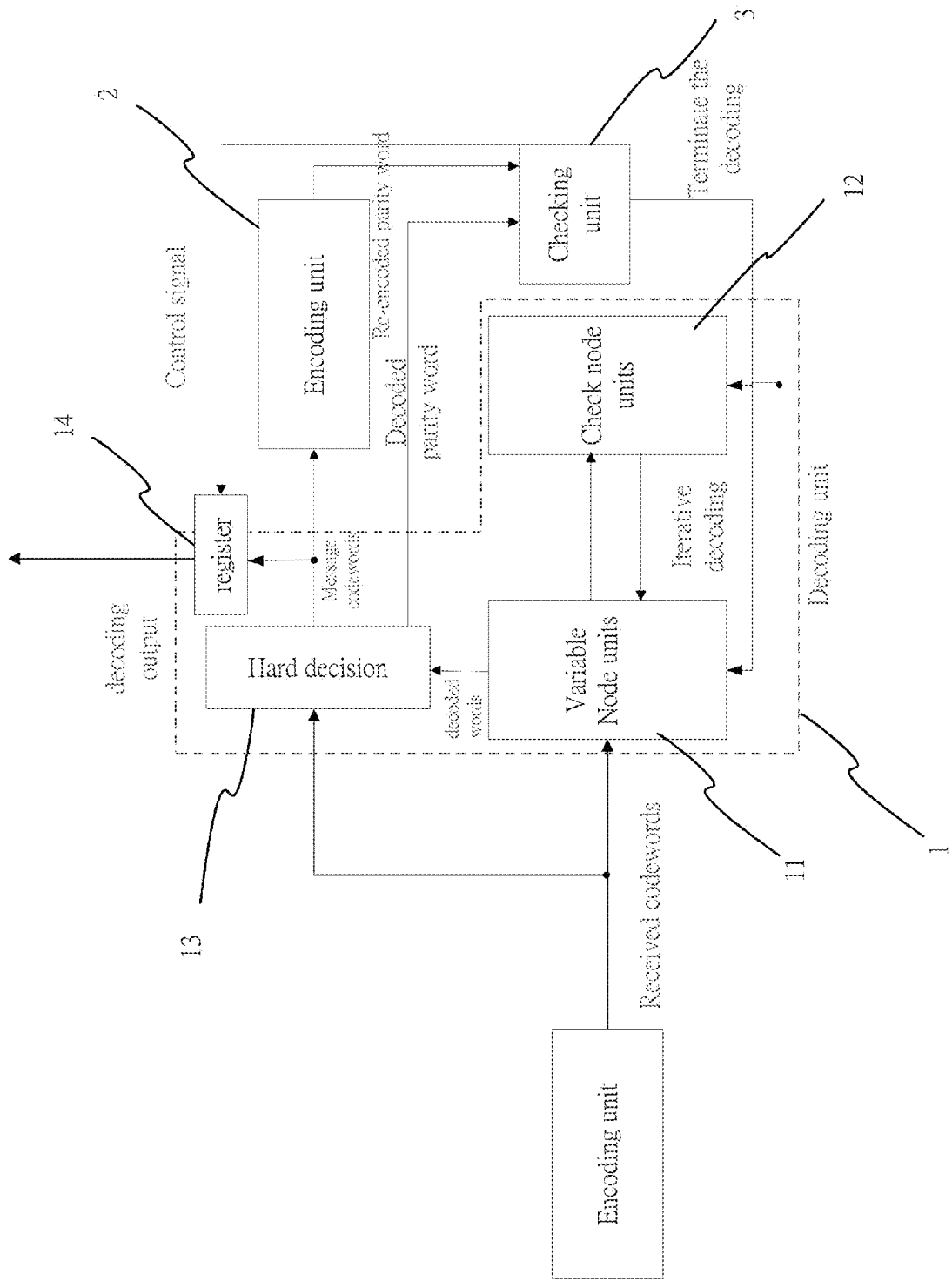
FIG. 3 is a schematic view of a configuration of implementing a method of early termination for channel decoding by re-encoding according to a second embodiment of the invention.
Figure 4:
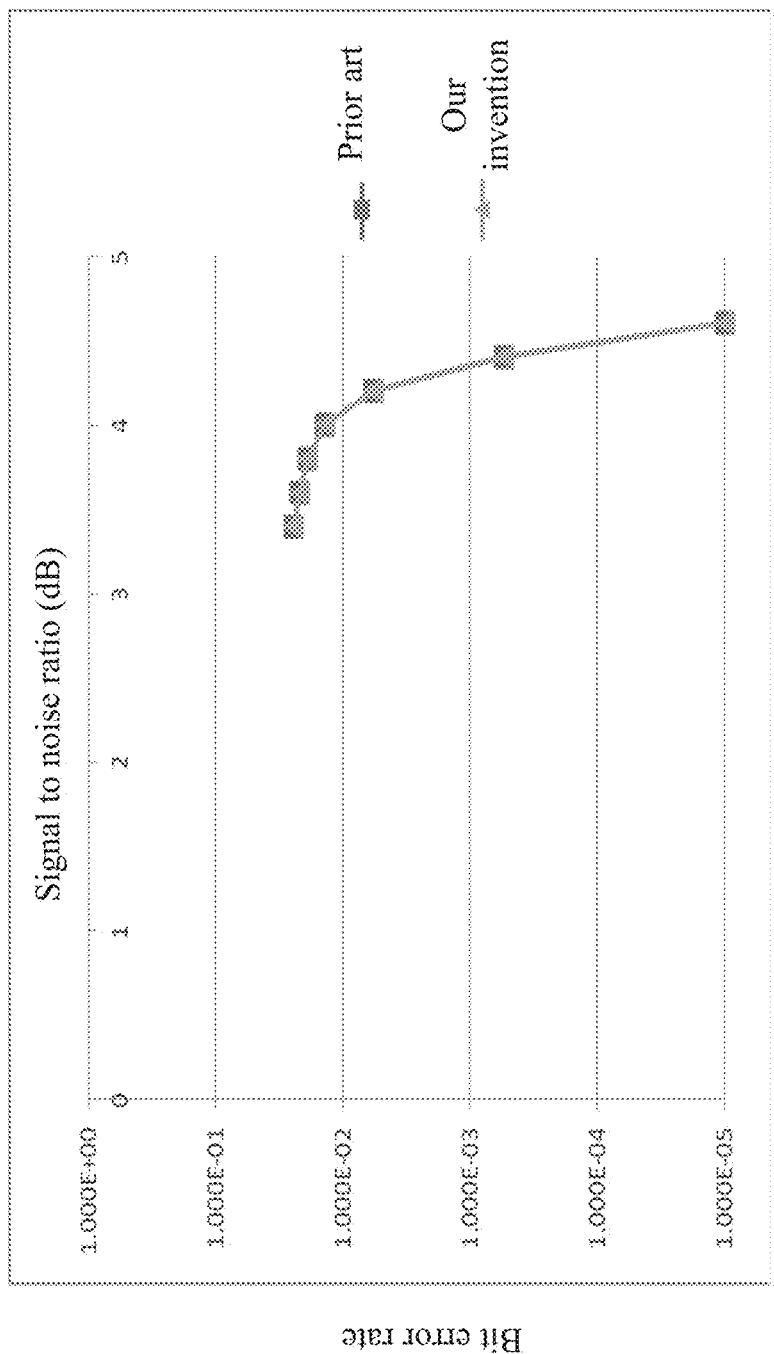
FIG. 4 is a schematic view of comparison in bit-error rate between the invention with the prior art.
Figure 5:
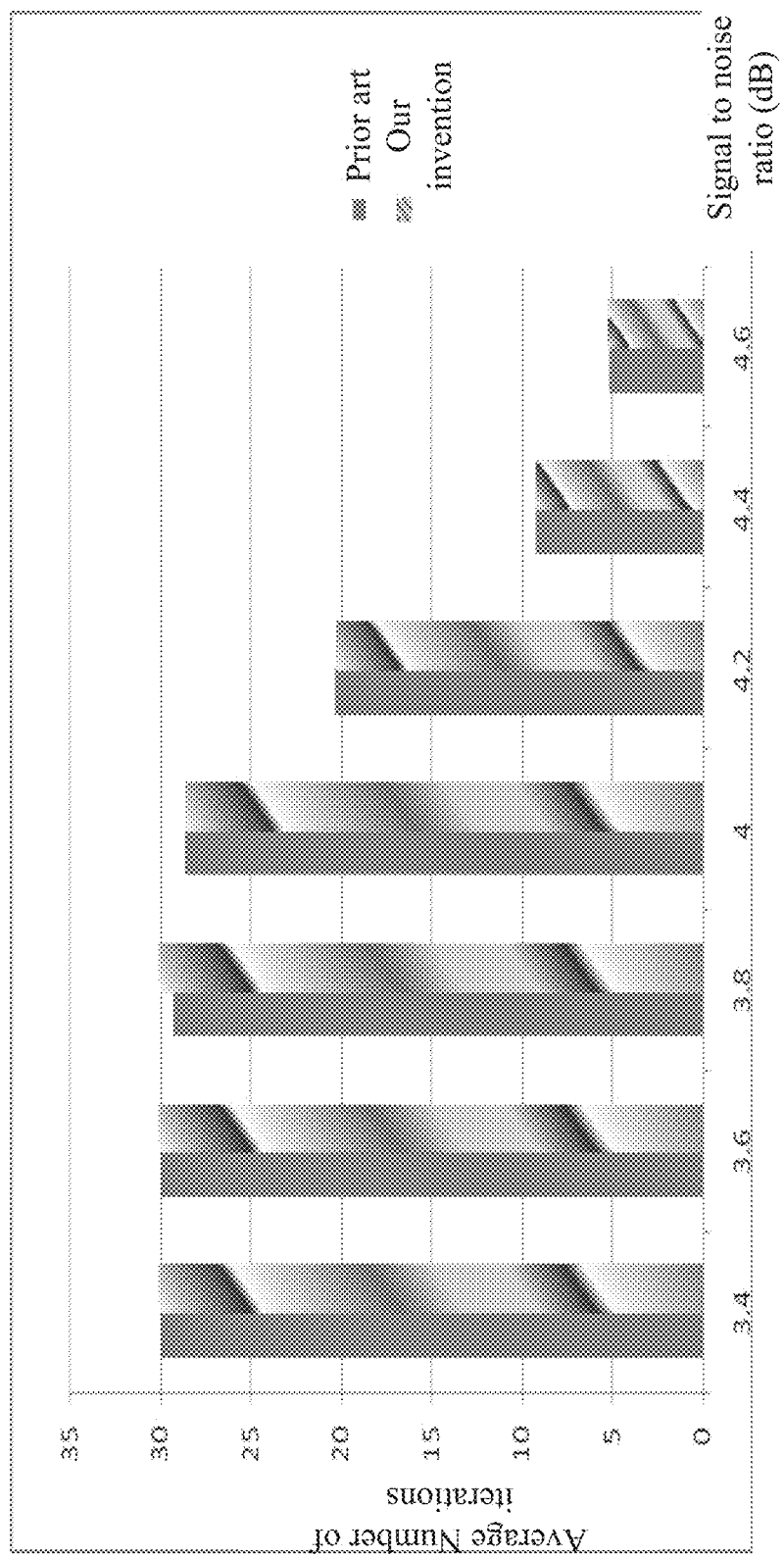
FIG. 5 is a schematic view of comparison in average number of iterations between the invention and the prior art.
Figure 6:
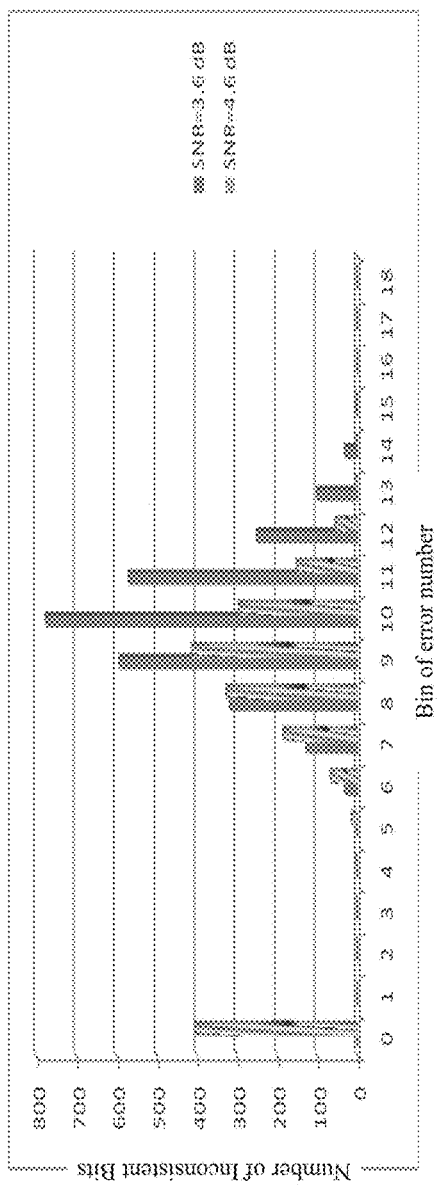
FIG. 6 is a schematic view of number of inconsistent bits between the re-encoded parity word and decoded parity word at signal-to-noise ratios of 3.6 (dB) and 4.6 (dB) according to the invention.

FIG. 2 is a schematic view of a configuration of implementing a method of early termination for channel decoding by re-encoding according to a first embodiment of the invention. FIG. 3 is a schematic view of a configuration of implementing a method of early termination for channel decoding by re-encoding according to a second embodiment of the invention. FIG. 4 is a schematic view of comparison in bit-error rate between the invention with the prior art. FIG. 5 is a schematic view of comparison in average number of iterations between the invention and the prior art. FIG. 6 is a schematic view of number of inconsistent bits between the re-encoded parity word and decoded parity word at signal-to-noise ratios of 3.6 (dB) and 4.6 (dB) according to the invention. As shown, the message words (data) encoded by an encoding unit 5 are sent to a channel 4 for transmission or storage. The channel 4 can be a wireless, wired transmission or storage medium or the like. In this embodiment, a systematic (6, 62)-regular (9300, 8405) low-density parity check code is used for illustration but it does not intend to limit the scope of the invention to this example. Equivalents which have the same concept can be applied to other error correcting code system.

When this invention is applied to decoding of the low-density parity check code, messages are exchanged through a plurality of variable node units 11 and check node units 12, and then decoded codewords are sent to a hard decision 13 to obtain the message codewords. The message words are sent back to the encoding unit 2 for re-encoding, and compared with the decoded codewords in the checking unit 3. If they are completely the same, then terminate the decoding and sent stored decoded messages from register 14.

If the error correcting code is a systematic code, it is only necessary to compare the re-encoded parity bits (parity word) with the decoded parity bits (parity word) to check if they are completely the same because the re-encoded codewords include original message words. This implementation only needs 895 2-input Exclusive-OR operations. In the prior art, the early termination requires that the parity check matrix of systematic (6, 62)-regular (9300, 8405) low-density parity check codes multiplies by the decoded codeword. Such a binary parity-check matrix is of 900×9300 and has 55800 elements which respectively have the value of 1. Therefore, this matrix multiplication needs 5800 2-input AND operations and 900 62-input Exclusive-OR operations. However, the hardware consumption according to the invention can be easily done by simple logical control at an encoding terminal and a decoding terminal, with significantly reduced complexity. If the comparison result is not entirely consistent, then it can use the number of inconsistent bits between the re-encoded parity word and decoded parity word to estimate the channel signal-to-noise ratio. The decoder (system) can use this information for the corresponding action. From FIG. 4 and FIG. 5, it is proved that the invention shows comparable results in terms of the average number of iterations and BER performance, compared to the prior art.

To increase decoding throughput at high signal-to-noise ratio, the channel value are sent to hard decision unit 13 and decoding unit 1. In the case of high signal-to-noise ratio in which incorrect codewords are seldom received, there is no need to decode received codewords with no error. Therefore the hard decision of the received codewords can be directly fed to the encoding unit for determination of early termination. It is assumed that the results of comparison for the codewords are correct and there is no need to decode, multiple operations of inter steps of decoding can be saved, and instead the re-encoding of the message words can be executed directly by the encoding unit. Thereby higher decoding throughput can be obtained.

Referring to FIG. 6, by using the number of inconsistent bits between the codeword after re-encoding and the decoded codewords, the consistent percentage is higher at high signal-to-noise ratio than at low signal-to-noise ratio. Such a percentage can be used to estimate the channel signal-to-noise ratio and can be for a reference to the whole system.

In summary, the method of early termination for channel decoding by re-encoding according to the invention effectively improves the various shortages in the prior art, and can achieve saved power consumption, simplified structure, improved decoding throughput and less hardware complexity. This makes the invention more progressive and more practical in use which complies with the patent law.

The descriptions illustrated supra set forth simply the preferred embodiments of the present invention; however, the characteristics of the present invention are by no means restricted thereto. All changes, alternations, or modifications conveniently considered by those skilled in the art are deemed to be encompassed within the scope of the present invention delineated by the following claims.

What is claimed is:

1. A system providing early termination for channel decoding by re-encoding at least comprising:
    a decoding unit including:
        a register;
        a plurality of variable node units receiving incoming codewords and decoding the incoming codewords;
        a plurality of check nodes units connected to the variable node units and exchanging messages therebetween; and
        a hard decision connected to the variable node units so as to receive the decoded codewords and to the register so as to forward the decoded codewords and also receiving the incoming codewords,
    an encoding unit connected to the hard decision, and
    a checking unit connected to the hard decision, to the variable node units, to the register, and to the encoding unit, wherein decoded message words produced from the variable node units are sent to the register via the hard decision and to the encoding unit via the hard decision for re-encoding; wherein re-encoded words are compared to decoded codewords by the checking unit; and if they are completely the same, then decoding action of the decoding unit is terminated.

2. The system of claim 1, wherein the checking unit is a logical circuit.

3. The system of claim 1, further comprising a channel unit that is wireless, wired or other medium for transmission or storage of the incoming codewords.

4. The system of claim 1, wherein if an error correcting code is a systematic code, then it only necessary to check by the checking unit to see if parity bits after re-encoding are the same with parity bits after decoding; and if yes, then stop decoding.

5. The system of claim 1, wherein if the comparison result of the re-encoded words and the decoded codewords is not entirely consistent, then a number of inconsistent bits is used to estimate channel signal-to-noise ratio, and the system uses this information for a corresponding action.

* * * * *